(12) United States Patent
Calmel et al.

(10) Patent No.: US 10,141,893 B2
(45) Date of Patent: Nov. 27, 2018

(54) INPUT STAGE OF AN AMPLIFIER AND CORRESPONDING AMPLIFIER

(71) Applicant: Devialet, Paris (FR)

(72) Inventors: Pierre-Emmanuel Calmel, Le Chesnay (FR); Alexandre Huffenus, Grenoble (FR)

(73) Assignee: Devialet, Paris (FR)

( * ) Notice: Subject to any disclaimer, the term of this patent is extended or adjusted under 35 U.S.C. 154(b) by 0 days.

(21) Appl. No.: 15/328,221

(22) PCT Filed: Jul. 23, 2015

(86) PCT No.: PCT/EP2015/066946
§ 371 (c)(1),
(2) Date: Jun. 6, 2017

(87) PCT Pub. No.: WO2016/012571
PCT Pub. Date: Jan. 28, 2016

(65) Prior Publication Data
US 2017/0272039 A1    Sep. 21, 2017

(30) Foreign Application Priority Data
Jul. 23, 2014  (FR) ..................................... 14 57117

(51) Int. Cl.
*H03F 3/68*      (2006.01)
*H03F 1/32*      (2006.01)
(Continued)

(52) U.S. Cl.
CPC .......... *H03F 1/3205* (2013.01); *H03F 1/086* (2013.01); *H03F 1/301* (2013.01); *H03F 3/16* (2013.01);
(Continued)

(58) Field of Classification Search
CPC ..... H03F 2200/03; H03F 2200/72; H03F 3/68
(Continued)

(56) References Cited

U.S. PATENT DOCUMENTS

| 2007/0135868 A1 | 6/2007 | Shi et al. |
| 2013/0002225 A1 | 1/2013 | Gomez |

(Continued)

FOREIGN PATENT DOCUMENTS

WO    2011107671 A1    9/2011

OTHER PUBLICATIONS

Dual-Current Sink for Digital-to-Analog Converter, IBM Technical Disclosure Bulletin, Aug. 1, 1987, pp. 1110-1111, vol. 30, No. 3.
(Continued)

*Primary Examiner* — Steven J Mottola
(74) *Attorney, Agent, or Firm* — Soquel Group LLC

(57) ABSTRACT

The input stage (16) of a high-fidelity amplifier (10) with high linearity and a low distortion rate comprises: —an input (12) for the digital signal to be converted; —a voltage output (26) for the converted voltage; —a digital/analog converter (20), the input of which forms the input (12) for the digital signal to be converted, the digital/analog converter (20) having access to a signal terminal (24); —a voltage current conversion resistor (36) arranged between the voltage output (26) and a reference potential; and —a current/voltage converter (22) that has a voltage output and is arranged between the signal terminal (24) and the voltage outlet (26). The current/voltage converter (22) comprises a transistor (46). The source of the transistor (46) is only connected to the signal terminal (24) of the digital/analog converter (20).

4 Claims, 1 Drawing Sheet

(51) Int. Cl.
*H03F 1/08* (2006.01)
*H03F 1/30* (2006.01)
*H03F 3/181* (2006.01)
*H03F 3/16* (2006.01)

(52) U.S. Cl.
CPC ......... *H03F 3/181* (2013.01); *H03F 2200/03* (2013.01)

(58) Field of Classification Search
USPC .......................................... 330/311; 381/120
See application file for complete search history.

(56) References Cited

U.S. PATENT DOCUMENTS

2014/0184339 A1    7/2014  Gomez et al.
2014/0269979 A1*  9/2014  Schafferer ............ H03F 3/2175
                                                                                            375/295

OTHER PUBLICATIONS

PCT/EP2015/066946, International Search Reportk dated Oct. 30, 2015, 6 pages.
FR 14-57117, Rapport de Recherche Préliminaire, May 11, 2015, 3 pages.

* cited by examiner

INPUT STAGE OF AN AMPLIFIER AND CORRESPONDING AMPLIFIER

CROSS-REFERENCES TO RELATED APPLICATIONS

This application claims priority benefit under 35 U.S.C. § 371 to International Patent Application No. PCT/EP2015/066946 entitled INPUT STAGE OF AN AMPLIFIER AND CORRESPONDING AMPLIFIER, and filed by inventors Pierre-Emmanuel Calmel and Alexandre Huffenus on Jul. 23, 2015. International Patent Application No. PCT/EP2015/066946 claims priority to French Patent Application No. 14 57117, filed on Jul. 23, 2014.

FIELD OF THE INVENTION

The present invention relates to an input stage of a high fidelity amplifier with high linearity and with a low distortion rate comprising:
  an input for the digital signal to be converted;
  a voltage output for the converted voltage;
  a digital-to-analog converter, the input of which forms the input for the digital signal to be converted, the digital-to-analog converter having a signal terminal;
  a resistance for converting the current into a voltage laid out between the voltage output and a reference potential; and
  a current-voltage converter at a voltage output, laid out between the signal terminal and the voltage output, the current-voltage converter comprising a transistor such that the gate of the transistor is connected to a voltage, the drain of the transistor is connected to a current source and the source of the transistor is connected to a digital-to-analog converter, the current source generating a continuous current (DC current).

BACKGROUND OF THE INVENTION

Such an input stage finds application in particular in a high linearity hi-fi amplifier.

In such an amplifier, it is common to use at the input, a digital-to-analog converter such as the component PCM 1792 from Texas Instruments. This digital-to-analog converter has a current output, so that the analog signal is modulated in intensity.

Insofar that the amplification stage placed downstream uses at the input a modulated voltage, a current-voltage converter should be placed between the digital-to-analog converter and the amplification stage strictly speaking.

The digital-to-analog converters with a current output are particularly appreciated for their very low harmonic distortion rate which they may attain. The difficulty consists of utilizing the properties of such digital-to-analog converters via a current-voltage conversion stage which itself has no impact on the performances of the digital-to-analog converter.

The current sources contained in such digital-to-analog converter are connected to one or several outputs connected to a virtual ground or further connected between a ground and one or several outputs connected to a virtual ground. Such connections are traditionally achieved by means of an operational amplifier circuit.

A virtual ground is a fixed potential.

In this way, all the transistors of the digital-to-analog converter operate with constant current and voltage, therefore optimally, regardless of the modulation of the output signal.

In order to preserve this lack of distortion, the current-voltage converters placed downstream may also, in an implementation different from that of an operational amplifier circuit, comprise specific stages said to be with a «common gate» based on MOSFET transistors (Metal Oxide Semiconductor Field Effect Transistors) or said to with a «common base» based on bipolar transistors. Such stages with a common gate or base operate in an open loop.

This type of circuit comprising transistors with a common base or gate, more commonly called "cascode" transistors, is described in document WO 2011/107671. In this document, the transistors of the stages with a common base or gate are connected at the level of their source to current sources.

At least one of the current sources is able to impose a biased current. The other current sources are notably able to cancel out the continuous component from the digital-to-analog converter so that only the variable component from the digital-to-analog converter is converted into a voltage by the current-voltage converter.

The cascode stage gives the possibility of guaranteeing that the current sources do not exhibit voltage variations on their terminals when the voltage at the voltage output of the current-voltage converter varies, and this even when this voltage varies by several tens of volts.

Further, such a cascode stage imposes a constant potential at the current output of the digital-to-analog converter, regardless of the voltage at the voltage output of the current-voltage converter.

Therefore, the quality of the information contained in the current from the digital-to-analog converter is preserved when this current is converted into a voltage by the resistance.

However, these current sources are notably, at the origin of substantial current consumption and at the origin of heating of the input stage.

SUMMARY

An object of the invention is therefore to propose a solution for minimizing the heating of the input stage.

For this purpose, the object of the invention is an input stage of a high fidelity amplifier with high linearity and with a low distortion rate of the aforementioned type, wherein the source of the transistor is exclusively connected to the signal terminal of the digital-to-analog converter.

According to particular embodiments, the converter comprises one or several of the following features:
  the digital-to-analog converter is able to generate a current comprising a continuous component and a fixed component, and the current source is able to provide a current equal to the continuous component of the current generated by the digital-to-analog converter;
  the digital-to-analog converter is with current absorption;
  the input stage is achieved on an integrated circuit.

The object of the invention is also a high linearity hi-fi amplifier and with a low distortion rate, comprising an input stage of the aforementioned type, and an amplification stage, connected in series to the input stage.

BRIEF DESCRIPTION OF THE DRAWINGS

The invention will be better understood upon reading the description which follows, exclusively given as an example and made with reference to the drawings wherein.

DETAILED DESCRIPTION

Figure 1:
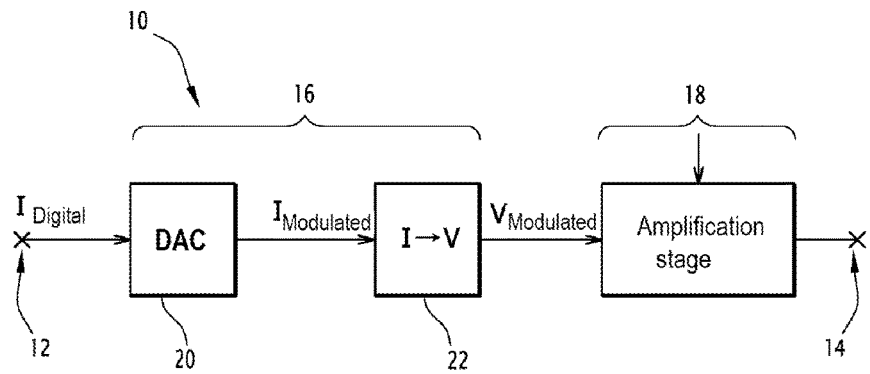
FIG. 1 is a schematic view of a high fidelity amplifier comprising an input stage according to the invention.

The amplifier 10, schematically illustrated in FIG. 1, is a hi-fi amplifier able to receive on an input 12 a digital signal and to produce on an output 14 an amplified analog signal.

As known per se, the amplifier 10 comprises an input stage 16 ensuring the conversion of the digital input signal into an output analog signal modulated in voltage, as well as an amplification stage 18, ensuring the supply of sufficient power for the load placed downstream, i.e. one or several loudspeakers. Preferably this is an amplification stage of class A.

The input stage 16 comprises a digital-to-analog converter 20, the input of which is connected to the input 12 of the amplifier for receiving a digital signal $I_{digital}$. This digital-to-analog converter is able to provide a current-modulated analog signal $I_{modulated}$. The digital-to-analog converter is for example a PCM 1792 from Texas Instruments.

The current $I_{modulated}$ comprises a variable component and a fixed component.

The output of the digital-to-analog converter 20 is connected to a current-voltage converter 22 according to the invention.

This current-voltage converter 22 is able to provide a modulated voltage $V_{modulated}$ with a voltage gain, from the modulated current $I_{modulated}$ produced by the digital-to-analog converter 20.

The output of the current-voltage converter 22 is connected to the input of the amplification stage 18, as known per se.

Figure 2:
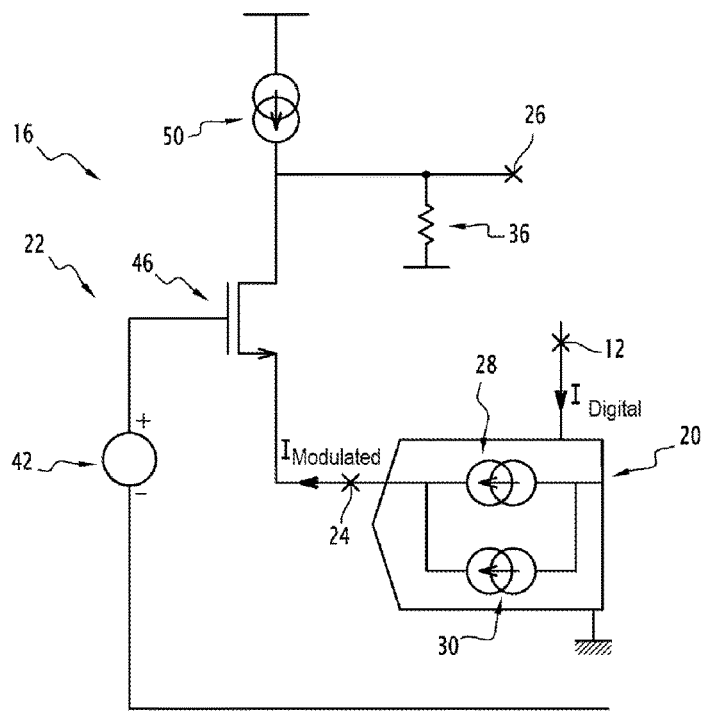
FIG. 2 is an electric diagram of an input stage of the amplifier of FIG. 1 according to the invention.

FIG. 2 illustrates the input stage 16 of the amplifier of FIG. 1.

In this FIG. 2, the digital-to-analog converter 20 is connected at the input to the input 12 of the amplifier 10 and has a signal terminal 24 for generating a current $I_{modulated}$ comprising a continuous component (DC component) and a fixed component. The digital-to-analog converter 20 is also connected to a ground.

The current-voltage converter 22 is connected to the signal terminal 24 of the digital-to-analog converter 20 and has a voltage output 26 able to be directly connected to the amplification stage 18.

The digital-to-analog converter 20 is schematized in FIG. 2 with two current sources 28 and 30. More specifically, the first current source 28 is able to generate the continuous component of the current $I_{modulated}$ at the output of the digital-to-analog converter 20. The second current source 30 as for it is able to generate the variable component of the current $I_{modulated}$ at the output of the digital-to-analog converter 20.

In FIG. 2, the digital-to-analog converter 20 is with current absorption and forms a current sink, commonly designated by "sink". The expression "with current absorption" means that the current $I_{modulated}$ at the signal terminal 24 of the digital-to-analog converter 20 is absorbed; i.e., that if the conventional direction of the current illustrated by the arrow illustrating the current $I_{modulated}$ in FIG. 2 is directed towards the transistor 46 and not towards the digital-to-analog converter 20, the current $I_{modulated}$ is always negative.

The digital-to-analog converter 20 is for example a converter AD 1955 from Analog Devices.

The current-voltage converter 22 comprises a conversion resistance 36, one terminal of which is connected to the voltage output 26, and the other terminal of which is connected to a reference potential.

The resistance 36 is able to convert the current $I_{modulated}$ at the output of the digital-to-analog converter 20 into a voltage $V_{modulated}$.

The current-voltage converter 22 further comprises at least one transistor 46 connected at its source to the digital-to-analog converter 22. In FIG. 2, only one transistor 46 is illustrated, however the current-voltage converter 22 may comprise several transistors 46.

The transistor 46 forms a cascode stage or with a common gate or base of the input stage 16.

The transistor 46 is for example a MOSFET transistor.

The current-voltage converter 22 also comprises a voltage source 42 connected to the gate of the transistor 46 of FIG. 2.

The current-voltage converter 22 further comprises a third current source 50 connected to the drain of the transistor 46.

The third current source 50 is able to generate a continuous bias current in the electric circuit of the input stage 16.

As visible in FIG. 2, the current-voltage converter 22 comprises a single current source 50 and the source of the transistor 46 is directly and exclusively connected to the current output of the digital-to-analog converter 20. In particular, no current source is connected between the transistor 46 and the digital-to-analog converter 20.

The current source 50 is such that the current generated by the current source 50 is equal to the current generated by the current source 28 of the digital-to-analog converter 20, therefore equal to the continuous component of the current $I_{modulated}$, this in order to have in the transistor 46 a non-zero current regardless of the value of the digital input signal. Indeed, the variable component of the current $I_{modulated}$ is always less in absolute value to the continuous component of the current $I_{modulated}$, so that the value of the latter is always of the same sign.

For example, if the continuous component of the current $I_{modulated}$ is equal to 3 mA and the variable component of this current $I_{modulated}$ is of 2 mA, then the current generated by the current source 50 is set to 3 mA.

The digital-to-analog converter 20 and the current-voltage converter 22 are made on a same integrated circuit, comprising a semi-conducting substrate, for example based on silicon. The integrated circuit is for example of the ASIC (acronym of Application-Specific Integrated Circuit) type.

Thus, such an input stage 16 of an amplifier gives the possibility of reducing the number of current sources of the current-voltage converter 22 by making use of the characteristics of the digital-to-analog converter 20.

Thus, such a circuit comprises less components and is therefore more compact to make on an integrated circuit and therefore less expensive.

Further, the reduction in the number of current sources decreases the risks of heating of the circuit and gives the possibility of saving energy.

The invention claimed is:

1. An input stage of an amplifier comprising:
an input for the digital signal to be converted;
a voltage output for the converted voltage;
a digital-to-analog converter, the input of which forms the input for the digital signal to be converted, the digital-to-analog converter comprising a signal terminal for generating a current;
a resistance for converting the current into a voltage, connected to said voltage output and to a reference potential; and a current-voltage converter with a voltage output, connected to said signal terminal and to said voltage output, the current-voltage converter comprising a transistor such that the gate of the transistor is connected to a voltage source, the drain of the transistor is connected to a current source and the source of the transistor is connected to said digital-to-analog converter, the current source generating a continuous current, wherein the source of said transistor is exclusively connected to said signal terminal of said digital-to-analog converter and wherein said digital-to-analog converter is able to generate a current comprising a continuous component and a fixed component, the current source being able to provide a current equal to the continuous component of the current generated by said digital-to-analog converter, said digital-to-analog converter being connected between a fixed potential and the source of said transistor.

2. The input stage according to claim 1, wherein the current generated at said signal terminal of said digital-to-analog converter flows into said digital-to-analog converter.

3. The input stage according to claim 1, wherein the input stage is made on an integrated circuit.

4. An amplifier comprising an input stage according to claim 1, and an amplification stage, connected in series with the input stage.

* * * * *